United States Patent [19]
Moritz et al.

[11] Patent Number: 5,530,351
[45] Date of Patent: Jun. 25, 1996

[54] NMR TOMOGRAPHY APPARATUS WITH COMBINED RADIO FREQUENCY ANTENNA AND GRADIENT COIL

[75] Inventors: Michael Moritz, Mistelgau; Guenther Pausch, Effeltrich, both of Germany

[73] Assignee: Siemens Aktiengesellschaft, Munich, Germany

[21] Appl. No.: 530,899

[22] Filed: Sep. 20, 1995

[30] Foreign Application Priority Data

Sep. 29, 1994 [DE] Germany .................. 44 34 951.3

[51] Int. Cl.[6] ................................................. G01V 3/00
[52] U.S. Cl. ................................. 324/309; 324/318
[58] Field of Search .................... 324/300, 307, 324/309, 310, 311, 312, 313, 314, 318, 322

[56] References Cited

U.S. PATENT DOCUMENTS

| | | | |
|---|---|---|---|
| 4,897,604 | 1/1990 | Carlson et al. | 324/318 |
| 5,337,001 | 8/1994 | McDougall et al. | 324/318 |

*Primary Examiner*—Michael Tokar
*Attorney, Agent, or Firm*—Hill, Steadman & Simpson

[57] ABSTRACT

In a combined radiofrequency antenna and gradient coil in a magnetic resonance imaging apparatus, radiofrequency signals are coupled into conductor loops of the gradient coil so that these loops are operated as elements of a radiofrequency antenna. The installation space for a separate radiofrequency antenna can thus be saved. Given the same patient-receiving volume, the diameter of the cylindrical opening of a magnet or the spacing between pole shoes can be reduced, so that the magnets can be more economically built.

7 Claims, 5 Drawing Sheets

NMR TOMOGRAPHY APPARATUS WITH COMBINED RADIO FREQUENCY ANTENNA AND GRADIENT COIL

BACKGROUND OF THE INVENTION

1. Field of the Invention

The present invention is directed to a nuclear magnetic tomography apparatus having a basic field magnet into which at least one gradient coil and one radiofrequency antenna are built.

2. Description of the Prior Art

As is known, a basic field magnet, which generates a magnetic field with which nuclear spins in an examination region are oriented in a specific direction, is required in a nuclear magnetic resonance tomography apparatus. Electromagnetic energy is emitted onto the examination subject with a radiofrequency antenna causing excursion of the nuclear spins onto out of this direction and the nuclear magnetic resonance signal arising as a result is received—possibly with the same radiofrequency antenna. A simple example of such a radiofrequency antenna is disclosed in U.S. Pat. No. 4,506,224. The radiofrequency antenna disclosed therein is composed of individual rods with their ends connected to ground via capacitors.

Magnetic gradient fields are required in an imaging apparatus for location-coding of the nuclear magnetic resonance signals, these magnetic gradient fields being generated for each spatial direction (for example, along the x,y,z axes of a Cartesian coordinate system) by a set of gradient coils. U.S. Pat. No. 4,486,711 discloses a simple example of such gradient coils.

As schematically shown in FIG. 1 herein, a superconductive basic field magnet has a cylindrical opening 1a which forms the examination space. In conventional systems, the volume within cylindrical opening 1a, is constricted by the gradient coils 3 and the radiofrequency antenna 2, which are to be applied inside the opening 1a. The diameter the cylindrical opening 1a is therefore correspondingly larger than that of the actual patient volume available for the examination. Since the latter should not fall below a certain minimum dimension in view of comfort for the patient, the size of the patient-receiving volume is defined by the fixed cylindrical opening 1a and the thickness of the radiofrequency antenna and the gradient coils. Further elements that are built into the basic field magnet, for example shim elements for improving the uniformity of the basic magnetic field, are not shown in FIG. 1 for clarity.

The outlay for the magnet becomes higher as the cylindrical opening becomes larger.

The above discussion also applies analogously to systems employing pole shoe magnets, where in the radiofrequency antenna and gradient coils are applied onto the pole shoes and the spacing between the pole shoes is determined by the height of the examination space minus the thickness of the radiofrequency the gradient coils.

SUMMARY OF THE INVENTION

It is therefore an object of the present invention to provide a nuclear magnetic resonance tomography apparatus of the type initially described wherein the basic field magnet can be kept as small as possible given a predetermined size of the patient volume available for examination.

As a result of the combination of radiofrequency antenna and gradient coil, the space required for these two elements can be made significantly smaller, so that, given a predetermined patient opening size, one can employ with a smaller, and thus more economical, basic field magnet.

DESCRIPTION OF THE PREFERRED EMBODIMENTS

Figure 1:
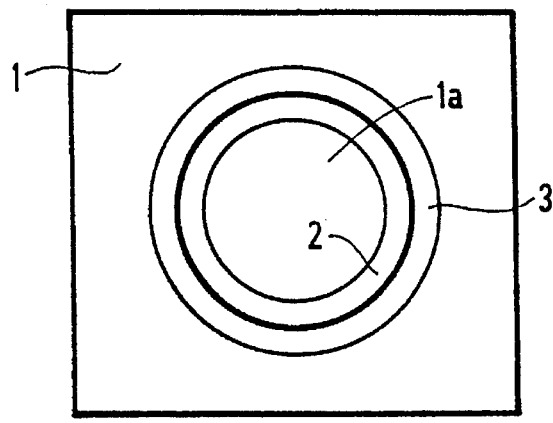
FIG. 1, as noted above, is a schematic illustration of a basic field magnet in a conventional magnetic resonance imaging system.
Figure 2:
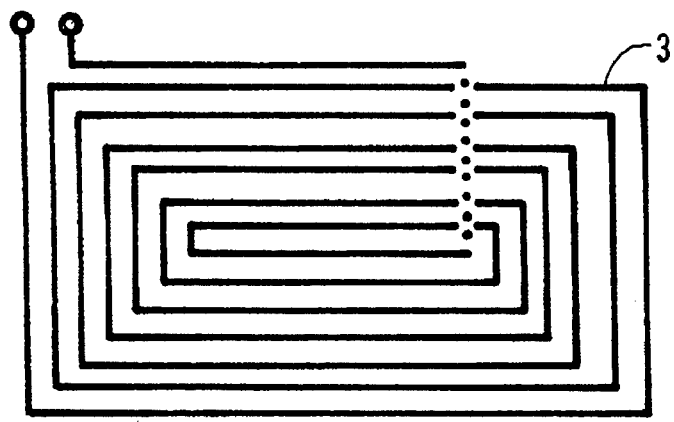
FIG. 2, as noted above, is a schematic illustration of a conventional gradient coil arrangement.

FIG. 2 shows a gradient coil 3. The return conductor that crosses the other conductor is shown with broken lines. The illustration is only schematic; the actual course of the conductors arises on the basis of complex calculations dependent on the demands made of the gradient field to be produced by the coil 3.

Figure 3:
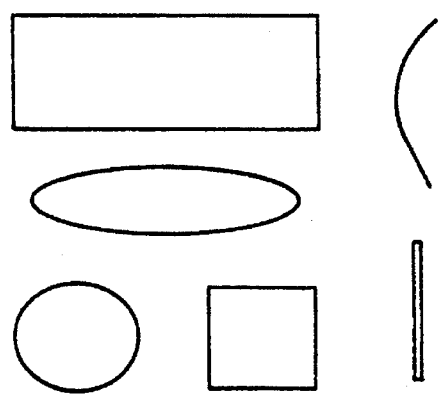
FIG. 3 illustrates various possibilities for the external shape of gradient coils in different types of NMR tomography systems.

FIG. 3 is intended to show that the outer contour of a gradient coil is not necessarily rectangular but may have other shapes, for example the shape of an ellipse. Further, a gradient coil can also be arranged on a curved surface.

Figure 4:
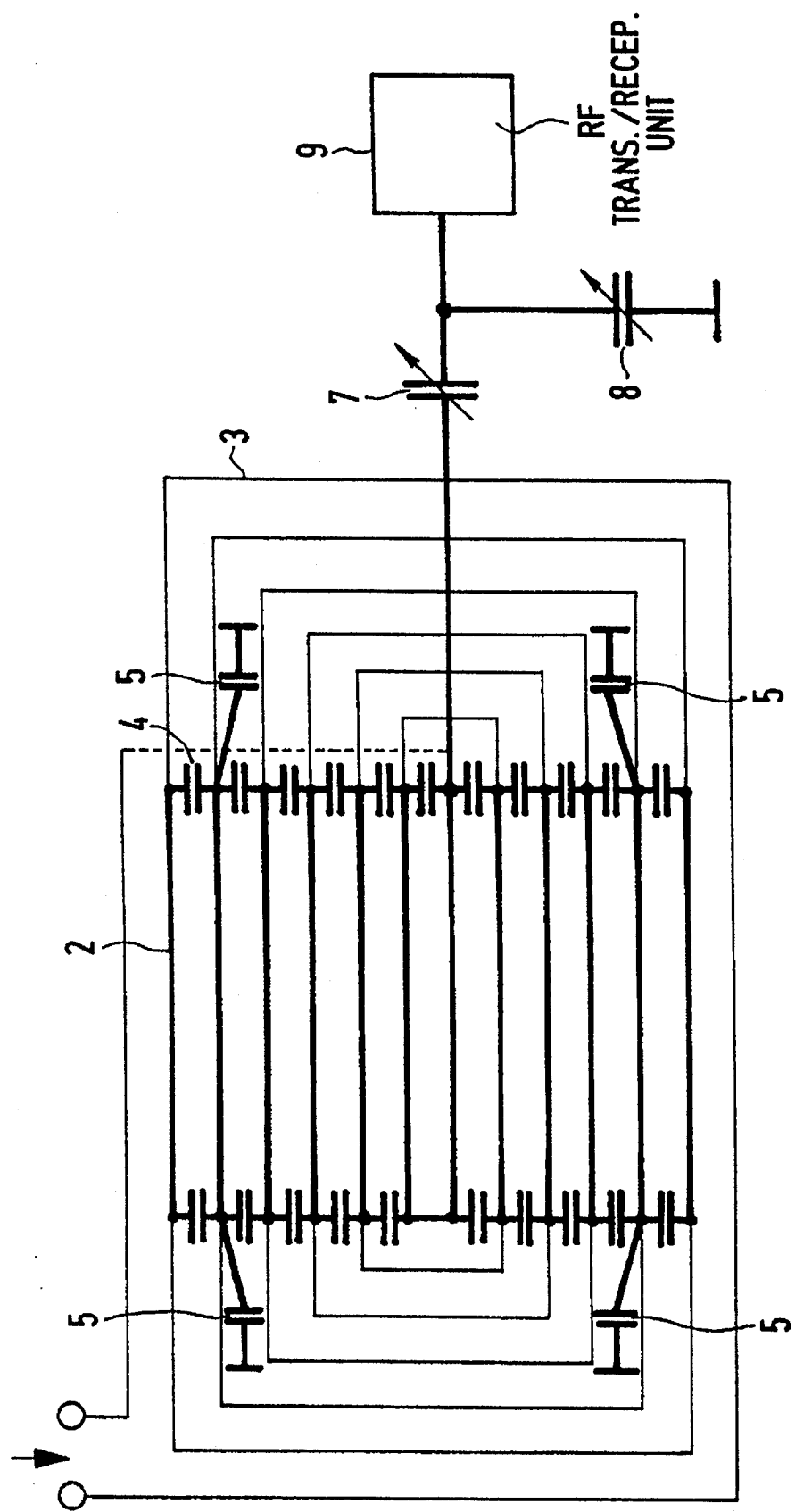
FIG. 4 illustrates a first exemplary embodiment of the invention.

Proceeding on the basis of a gradient coil structure according to FIG. 2, FIG. 4 shows how this can be simultaneously used as a radiofrequency antenna. The conductor parts to be exclusively allocated to the gradient coil 3 are thereby shown with thin lines the conductor parts active for the radiofrequency antenna 2 are shown with thick lines. Neighboring conductor loops of the gradient coil 3 are connected to one another with high-frequency bridge capacitors 4 such that the high-frequency current can propagate over a number of conductor loops. The high-frequency bridge capacitors 4 are dimensioned such that they represent a short for the radiofrequency signals that, for example, lie in the frequency range of 60 Mhz, whereas they can be practically neglected at the significantly lower operating (switching) frequency of the gradient coil 3.

In the exemplary embodiment of FIG. 4, the four corners of the antenna structure formed of the conductor sections of the gradient coil 3 and the high-frequency bridge capacitors 4 are connected to ground via capacitors 5. These capacitors 5 act as resonance capacitors.

Overall, a nearly planar antenna structure arises, that is connected to a radiofrequency transmission/reception unit 9 via a matching network composed of a series capacitor 7 and a capacitor 8.

Figure 5:
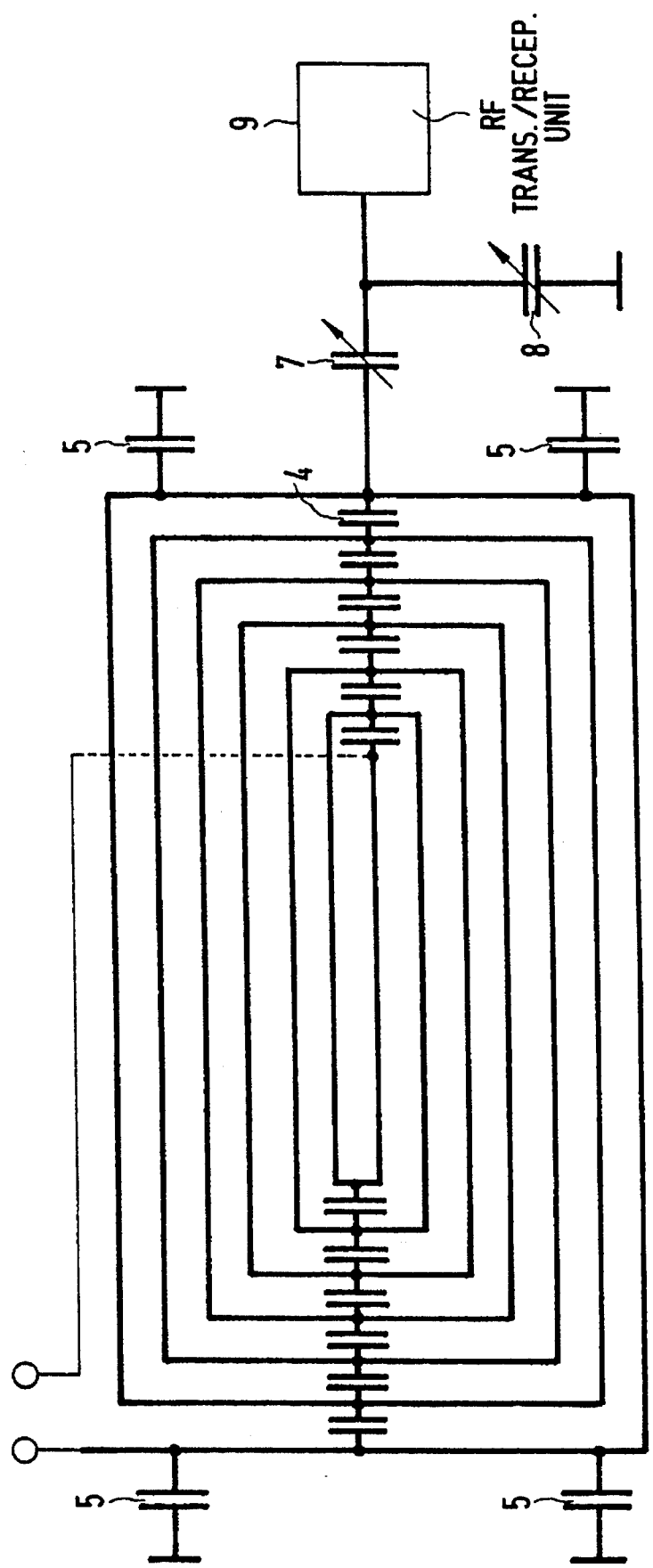
FIG. 5 illustrates a second exemplary embodiment of the invention.

In the exemplary embodiment of FIG. 5, the individual turns are bridged such by high-frequency bridge capacitors 4 such that the complete gradient coil 3 is active as a radiofrequency antenna. The capacitors 5 serving as resonance capacitors are arranged at the four corners of the overall gradient coil 3. In this exemplary embodiment, the radiofrequency antenna has a larger area compared to the exemplary embodiment of FIG. 4 wherein only a part of the gradient coil 3 is used as the radiofrequency antenna.

Dependent on the size of the area or surface required for the radiofrequency antenna, conductor parts of various gradient coils (for example, respective gradient coils for the x-direction and the y-direction) can be interconnected to form a radiofrequency antenna structure by connection via high-frequency bridge capacitors. If a circularly polarized antenna is desired, by contrast, the individual segments of the gradient coils will be operated as separate radiofrequency antenna structures.

Figure 6:
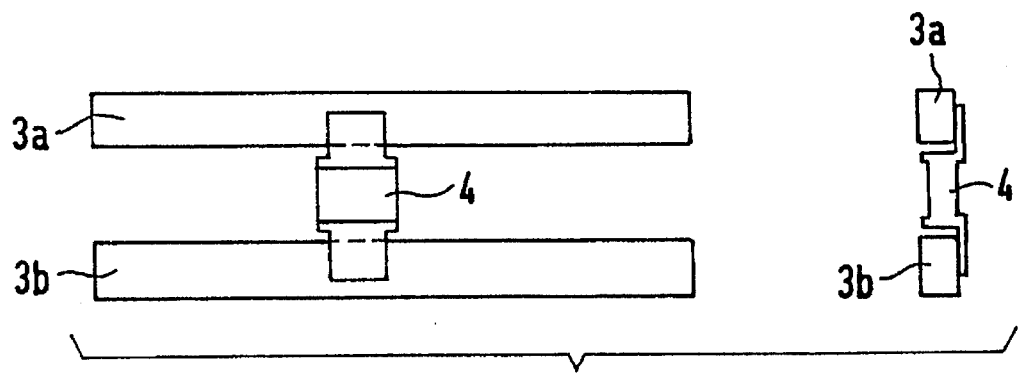
FIGS. 6–8 respectfully show various possibilities for realizing the high-frequency capacitors employed in the invention.
Figure 7:
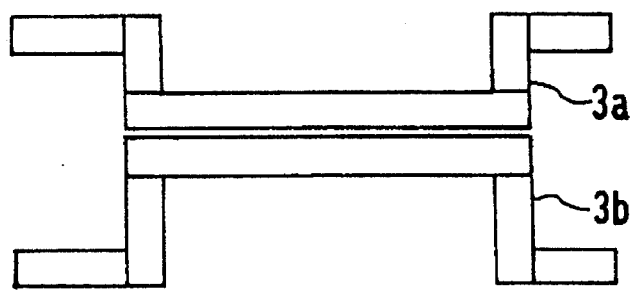

The high-frequency bridge capacitors 4 can be implemented as discrete capacitors between two conductor loops 3a and 3b of the gradient coil, as shown in plan view and side view in FIG. 6. As shown in FIG. 7, however, neighboring conductor sections 3a and 3b of neighboring gradient coils can also be disposed so closely to one another that an adequate capacitance arises between these sections without requiring separate components.

Figure 8:
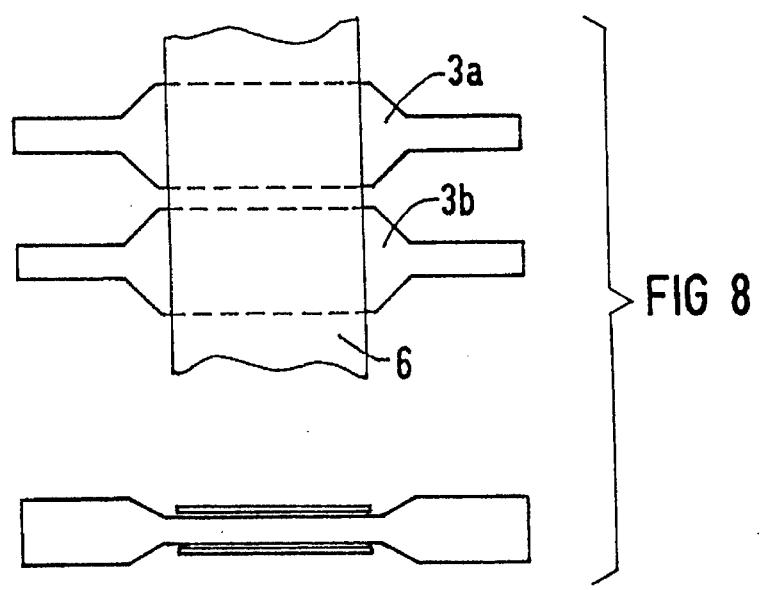

A further possibility for realizing a capacitance between neighboring conductor sections is shown in FIG. 8. Individual conductor sections 3a and 3b, which are planar, are bridged with a metal foil 6 with a dielectric interposed between the sections 3a and 3b.

Figure 9:
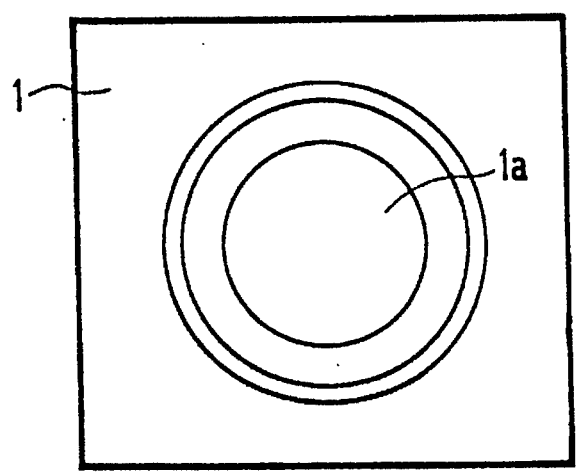
FIG. 9 is a schematic sectional view through a nuclear magnetic resonance tomography apparatus of the invention.

Substantial space in the cylindrical opening 1a of the magnet of a superconductive magnet system, between the pole shoes of a pole shoe magnet, can be saved with the illustrated combination of radiofrequency antenna and gradient coil since—as indicated in FIG. 9—only one element, rather than two elements (gradient coil and radiofrequency antenna) as in conventional systems, need be accommodated. Given the same patient receiving volume, the cylindrical opening 1a of the magnet, or the spacing between the pole shoes, can be made smaller, leading to a significant cost reduction for the magnet.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a nuclear magnetic resonance tomography apparatus having a basic field magnet, the improvement comprising:

at least one gradient coil combined with a radiofrequency antenna built onto said basic field magnet, said gradient coil having conductor loops; and means for coupling radiofrequency signals into said conductor loops of said gradient coil for operating said conductor loops as said radiofrequency antenna.

2. The improvement of claim 1 further comprising a plurality of high-frequency bridge capacitors connecting said conductor loops to each other, said high-frequency bridge capacitors permitting high-frequency current to propagate through a plurality of said conductor loops.

3. The improvement of claim 1 further comprising a plurality of capacitors respectively connecting said conductor loops to ground.

4. The improvement of claim 1 wherein each of said conductor loops has conductor sections, and further comprising a plurality of high-frequency bridge capacitors respectively connecting adjacent conductor loops, each high-frequency bridge capacitor being formed by adjacent conductor sections of the respective conductor loops with a dielectric disposed between said surfaces.

5. The improvement of claim 1 further comprising a plurality of gradient coils, each gradient coil having conductor loops, and wherein a plurality of conductor loops of different gradient coils are connected by respective high-frequency connections for forming said radiofrequency antenna.

6. The improvement of claim 5 further comprising a plurality of high-frequency bridge capacitors respectively connecting neighboring conductor elements of neighboring gradient coils, each high-frequency bridge capacitor being formed by said neighboring conductor elements bridged with a metal foil with a dielectric disposed between said neighboring conductor elements.

7. The improvement of claim 1 further comprising a plurality of discreet components respectively comprising high-frequency bridge capacitors connecting said conductor loops and permitting high-frequency current to propagate over a plurality of said conductor loops.

* * * * *